United States Patent
Vogt

(10) Patent No.: US 9,167,691 B2
(45) Date of Patent: Oct. 20, 2015

(54) DUAL INTERFACE MODULE AND DUAL INTERFACE CARD HAVING A DUAL INTERFACE MODULE MANUFACTURED USING LASER WELDING

(71) Applicant: Identive Group, Inc., Santa Ana, CA (US)

(72) Inventor: Werner Vogt, Remetschwil (CH)

(73) Assignee: Identive Group, Inc., Santa Ana, CA (US)

( * ) Notice: Subject to any disclaimer, the term of this patent is extended or adjusted under 35 U.S.C. 154(b) by 154 days.

(21) Appl. No.: 13/863,834

(22) Filed: Apr. 16, 2013

(65) Prior Publication Data

US 2014/0307405 A1    Oct. 16, 2014

(51) Int. Cl.
  *H05K 1/11*     (2006.01)
  *G06K 19/077*   (2006.01)
  *H05K 3/32*     (2006.01)

(52) U.S. Cl.
  CPC .......... *H05K 1/112* (2013.01); *G06K 19/07775* (2013.01); *H05K 1/113* (2013.01); *H05K 3/328* (2013.01); *H05K 2201/10098* (2013.01); *H05K 2201/10674* (2013.01); *Y10T 29/49018* (2015.01); *Y10T 29/49139* (2015.01)

(58) Field of Classification Search
  CPC .................................................... H05K 1/112
  USPC .................. 361/767, 737, 728; 257/774, 775, 257/784–786
  See application file for complete search history.

(56) References Cited

U.S. PATENT DOCUMENTS

| | | | |
|---|---|---|---|
| 5,898,215 A | 4/1999 | Miller et al. | |
| 6,489,682 B1 * | 12/2002 | Yeh et al. | 257/738 |
| 6,568,600 B1 | 5/2003 | Carpier et al. | |
| 7,253,024 B2 | 8/2007 | Yu et al. | |
| 2002/0172025 A1 * | 11/2002 | Megahed et al. | 361/767 |
| 2006/0054709 A1 | 3/2006 | Lee | |
| 2006/0255157 A1 | 11/2006 | Launay et al. | |
| 2008/0191029 A1 | 8/2008 | Deloche | |
| 2008/0245879 A1 | 10/2008 | Artigue et al. | |
| 2008/0283615 A1 | 11/2008 | Finn | |
| 2009/0151150 A1 | 6/2009 | Ayala et al. | |
| 2012/0193436 A1 | 8/2012 | Sutera | |

OTHER PUBLICATIONS (C2) International Search Report and Written Opinion from co-pending international patent application No. PCT/US2014/034349, 9 pages.
Notice of Allowance for U.S. Appl. No. 13/853,582, dated Mar. 18, 2014, 19 pages.

* cited by examiner

*Primary Examiner* — Jenny L Wagner
*Assistant Examiner* — Jessey R Ervin
(74) *Attorney, Agent, or Firm* — Proskauer Rose LLP

(57) ABSTRACT

Dual interface modules, and methods for manufacturing the same, are described. A substrate layer is provided with at least one dual interface section. At least two first through-holes are formed in the substrate in each dual interface section. A first connection element is arranged in each first through-hole. Each first connection element is connected to a contact pad that is arranged on a first side of the substrate. Each first connection element is connected to a connection pad that is arranged on a second side of the substrate. At least one electronic element is arranged on the second side of the substrate in each dual interface section. Two second through-holes are formed in the substrate in each dual interface section. Two soldering pads with a first side and a second side are arranged on the second side of the substrate layer.

5 Claims, 7 Drawing Sheets

DUAL INTERFACE MODULE AND DUAL INTERFACE CARD HAVING A DUAL INTERFACE MODULE MANUFACTURED USING LASER WELDING

FIELD OF THE INVENTION

The subject matter of the application relates generally to a dual interface module and a dual interface card having a dual interface module, and to methods for manufacturing the same using laser welding.

BACKGROUND

As the use of plastic cards for credit cards, identification cards and the like continues to become more widespread, credit card fraud and identification card fraud are becoming increasing problems. The ease in which criminals have been able to manufacture or manipulate known cards is a result of the existence of the easily-altered magnetic stripe storage medium used by current cards. These magnetic stripes are easy to program and reprogram using commonly available technology, resulting, e.g., in so-called magnetic stripe cloning.

Thus, there is a need in the plastic card industry to provide a more secure plastic card that is more difficult or nearly impossible to duplicate or to manipulate. The likely successor to the magnetic stripe cards is known as a memory card or smart card. The smart card can generally be described as a card having an integrated circuit with memory that is capable of securely storing data and/or executing processing functions.

Contact smart cards make contact through several contact pads place on the surface of the card. These pads provide electrical connectivity when inserted into a reader, which is typically used as a communications medium between the smart card and a host. Cards typically do not contain batteries—power is supplied by the card reader—through some of these contact pads.

The most recent development in smart cards is a contactless card that interacts with a terminal reader using electromagnetic coupling. The smart card incorporates an inlay that is a symmetrical substrate incorporating a micro chip bounded to an antenna and functioning as the heart of a radio-frequency identification (RFID) part, a near field communication (NFC) chip, or similar chip credential. This smart card requires only proximity to a reader antenna to communicate. Contactless cards also typically operate without batteries and obtain power through induction from the electromagnetic field of the reader antenna. When in proximity to a reader antenna, they accumulate charge from the electromagnetic field, power up and consequently respond to commands over the same radio frequency channel, communicating in a bi-directional manner. Contactless technology is rapidly replacing traditional machine readable identification technologies in numerous applications such as those employing bar codes and magnetic stripes, offering substantially enhanced security and convenience.

For some applications it is preferred to provide a smart card that allows insertion into a reader, as well as contactless interaction. These so-called dual-interface cards implement contactless and contact interfaces on a single card, sometimes with some shared storage and processing. However, when manufacturing such cards, the electrical connections of a dual interface module that include the chip and the contact pads for contact operation, as well as an antenna with contacts for contactless operation that are embedded in the same card body, causes problems.

SUMMARY

Therefore, what is needed is a dual interface module that can be used to produce a dual interface card that does not have to be connected to a separate antenna when making a personalized plastic card.

The invention, in one aspect, features a dual interface module comprising a substrate layer, at least two pairs of a contact pad and a connection pad, wherein each contact pad is arranged on a first side of the substrate layer, each connection pad is arranged on a second side of the substrate layer and a first through hole is arranged in the substrate layer between each contact pad and connection pad, at least one electronic element that is arranged on the second side of the substrate layer, two soldering pads with a first side and a second side that are arranged on the second side of the substrate layer, wherein a second through hole is arranged in the substrate layer adjacent to a first side of each soldering pad, at least two first connection elements, wherein each first connection element is arranged in a first through-hole and electrically connects one of the contact pads with one of the connection pads, at least two second connection elements, wherein each second connection element electrically connects one of the connection pads with the electronic element, and two third connection elements, wherein each third connection element electrically connects the electronic element with a soldering pad. The module can be soldered in a cavity in a plastic card body including an antenna to form a dual interface card.

The invention, in another aspect, features a method for manufacturing a dual interface module. A substrate layer is provided. At least one dual interface section is formed on the substrate layer. At least two first through-holes are formed in the substrate layer in each dual interface section. A first connection element is arranged in each first through-hole. Each first connection element is electrically connected to a contact pad that is arranged on a first side of the substrate layer. Each first connection element is electrically connected to a connection pad that is arranged on a second side of the substrate layer. At least one electronic element is arranged on the second side of the substrate layer in each dual interface section, where the electronic element is electrically connected to each of the connection pads in the same dual interface section. An antenna pad comprising an antenna is arranged on the second side of the substrate layer in each dual interface section, where each electronic element is electrically connected to the antenna pad in the same dual interface section In some embodiments, the at least one electronic element is electrically connected to each of the connection pads in the same dual interface section via a second connection element and electrically connected to each of the soldering pads in the same dual interface section via two third connection elements and all second connection elements and all third connection elements are wire bonds.

In some embodiments, the at least one electronic element is electrically connected to each of the connection pads in the same dual interface section via flip chip connections and electrically connected to the antenna pad in the same dual interface section via flip chip connections. In some embodiments, the first connection elements are provided by covering the walls of the through-holes with an electrically conductive material.

In some embodiments, the contact pads are provided by plating the whole first side of the substrate layer with a metal and then partly removing said metal via etching to form the contact pads. In some embodiments, the connection pads are provided by plating the whole second side of the substrate layer with a metal and then partly removing said metal via etching to form the connection pads. In some embodiments, the electrically conductive material and the metal are gold, nickel-gold, silver, tin, tin-lead, or cadmium.

In some embodiments, several dual interface sections are formed on the substrate layer and several dual interface modules are produced by cutting each dual interface section out of the substrate layer. This technique allows the easy and efficient production of several dual interface modules.

In some embodiments, any of the above aspects can include one or more of the following features. In some embodiments, the substrate layer comprises an epoxy laminate that allows high reliability and performance of the dual interface module due to its low dielectric constant. Said epoxy laminate may be a glass tape that is impregnated in an epoxy resin. Optionally, said epoxy laminate may be laminated with a copper layer.

In some embodiments, the substrate layer comprises a polyimide film. In some embodiments, the substrate layer comprises a polyethylene terephthalate film. In some embodiments, the substrate layer has a thickness especially in the range from 100 µm to 150 µm.

To allow good electrical contacting of the electronic element via the contact pads, in some embodiments said contact pads are comprised of gold. In some embodiments, the contact pads are comprised of nickel-gold, silver, tin, tin-lead, or cadmium. In some embodiments, the contact pads have a thickness in the range from 20 µm to 60 µm to allow sufficient stability of the contact pads and a low increase in the thickness of those areas of the substrate layer that are padded with the contact pads, when compared to the unpadded part of the substrate layer. In some embodiments, at least one through-hole extends through a connection pad. This allows a soldering pad to be positioned under a connection pad. In some embodiments, said connection pads also consist of gold, nickel-gold, silver, tin, tin-lead, or cadmium.

In some embodiments, the electronic element is a chip comprising a radio frequency identification (RFID) part, a near field communication (NFC) chip, or a similar dual interface device.

In some embodiments, the second connection elements and the third connection elements are wire bonds. In some embodiments, the second connection elements and the third connection elements are flip chip connection elements.

In some embodiments, each soldering pad comprises a fourth through-hole that contacts a second through-hole of the substrate layer. In some embodiments, each soldering pad forms a tongue that covers a second through-hole of the substrate layer.

In some embodiments, the first connection elements are provided by covering the walls of the first through-holes with an electrically conductive material. This allows easy production of said first connection elements. In some embodiments, the walls of the second through-holes are covered with the same electrically conductive material as the first through-holes and the contact pads are partly removed so that no contact pad contacts an electrically conductive material arranged in a second through hole. This allows covering the walls of the first through-holes with an electrically conductive material without the need to protect the second through-holes from the covering material. Partly removing the contact pads prevent them from being electrically connected to the soldering pads via the electrically conductive covering of walls of the second through holes.

In some embodiments a soldering material is arranged on the second side of each soldering pad.

The invention, in another aspect, features a dual interface card comprising a plastic card body, an antenna pad arranged in the plastic card body, a cavity arranged in the plastic card body, and a dual interface module as described herein arranged in the cavity. It should be appreciated that although a card is described as an exemplary embodiment, other physical articles (e.g., tags, labels, stickers and the like) can be used in conjunction with the techniques described herein without departing from the scope of the invention.

In some embodiments, at least one optic or haptic characteristic of the substrate layer is equal to the same optic or haptic characteristic of the plastic card body to provide the dual interface card with a uniform appearance. In some embodiments, the plastic card body consists of polyvinyl chloride.

The antenna pad comprises an antenna. In some embodiments, the antenna pad further comprises a metal. In some embodiments, the antenna pad further comprises a soldering material.

In some embodiments, the cavity comprises an indention and the substrate layer, the contact pads, the contact pads, the soldering pads, the soldering materials and the first connection elements are completely arranged outside of the indention, the electronic element is arranged inside and outside of the indention, the connection pads are arranged at least outside of the indention, and the second connection elements and the third connection elements are arranged at least inside the indention. Since the electronic element is the biggest component arranged on the substrate layer, forming the indention to partly accept the electronic element allows positioning the dual interface module in the plastic card body by removing little material from the plastic card body.

In some embodiments, the depth of the cavity, not including the depth of the indention, is at least equal to the sum of the thickness of the substrate layer, the soldering pads and the soldering material to avoid the substrate layer being higher than the surface of the plastic card body. In some embodiments, the depth of the cavity not including the depth of the indention, is equal to the sum of the thickness of the substrate layer, the soldering pads, the soldering material and the contact pads, so that the contact pads are level with the surface of the plastic card body. In some embodiments, a resin is arranged inside the indention to fix the electronic element in the indention. Said resin may be an adhesive.

The invention, in another aspect, features a method for manufacturing a dual interface card. A plastic card body including an antenna is provided. A cavity is formed in the plastic card body. A part of the antenna pad is removed at at least two positions to form two antenna contact areas. A dual interface module of the type described herein is positioned in the cavity, where a soldering material is arranged between each soldering pad of the dual interface module and an antenna contact area. Each soldering pad of the dual interface module is soldered to an antenna contact area by heating each soldering pad.

In some embodiments, a soldering material is arranged on each antenna contact area before positioning the dual interface module in the cavity. In some embodiments, an indentation is formed in the cavity and a portion of the electronic element of the dual interface module is arranged in the indentation. In some embodiments, a resin is inserted in the indentation before bonding the dual interface module in the cavity. Said resin may be an adhesive. In some embodiments, each soldering pad of the dual interface module is heated by guiding a laser beam on each soldering pad through the second through holes of the dual interface module. In some other embodiments, each soldering pad of the dual interface module is heated by inserting a heating element in the second through holes of the dual interface module.

Other aspects and advantages of the invention will become apparent from the following detailed description, taken in conjunction with the accompanying drawings, illustrating the principles of the invention by way of example only.

BRIEF DESCRIPTION OF THE DRAWINGS

The advantages of the invention described above, together with further advantages, may be better understood by referring to the following description taken in conjunction with the accompanying drawings. The drawings are not necessarily to scale, emphasis instead generally being placed upon illustrating the principles of the invention.

DETAILED DESCRIPTION

Figure 1:
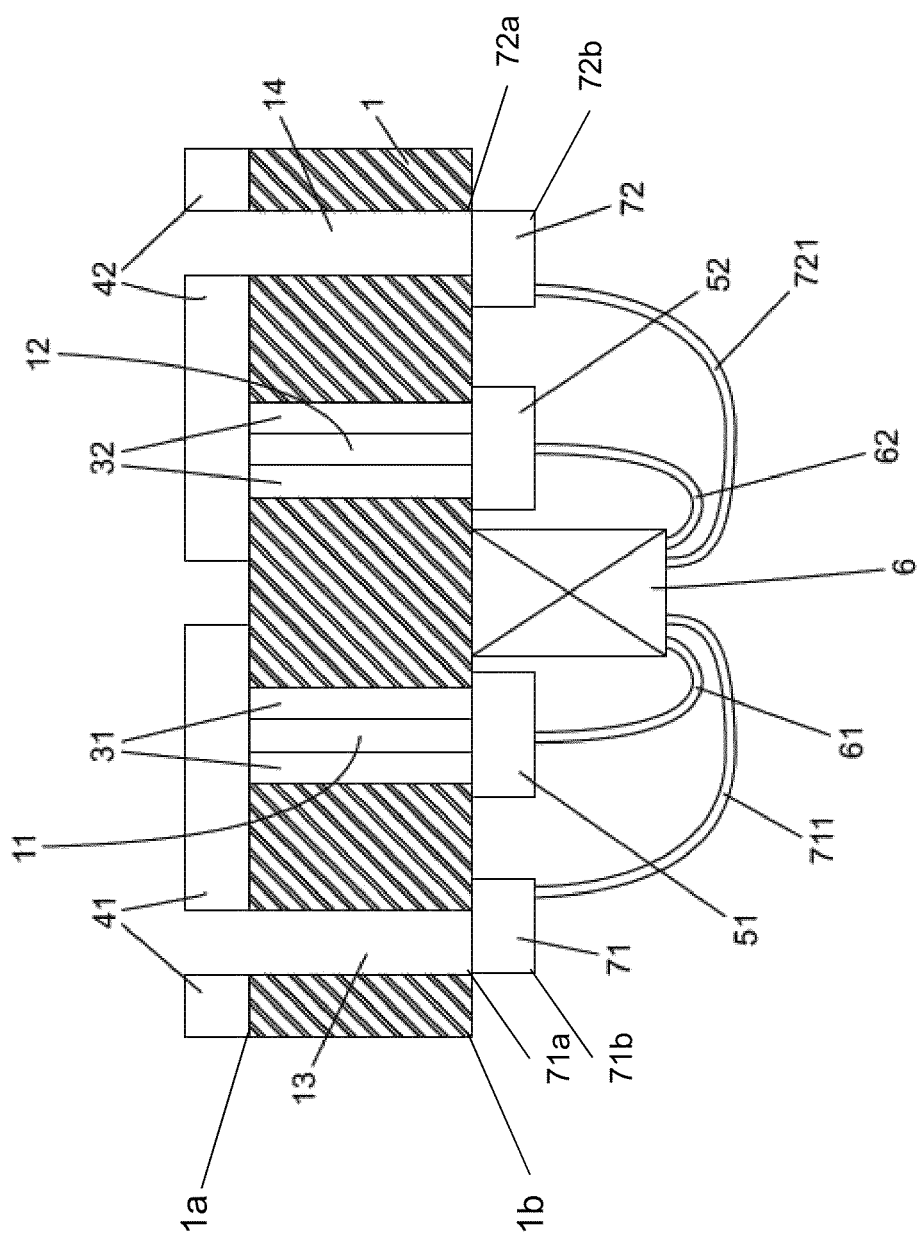
FIG. 1 shows a cross-sectional view of a dual interface module according to an embodiment of the invention.
Figure 4:
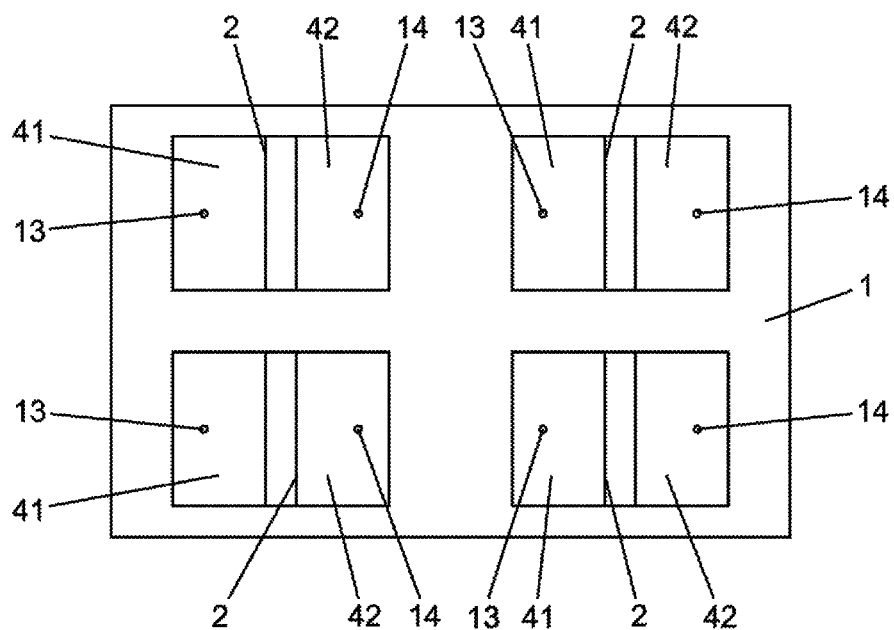
FIG. 4 shows a top view of a substrate layer with several dual interface sections according to an embodiment of the invention.

FIG. 1 shows a cross-sectional view of a dual interface module according to an embodiment of the invention. Several dual interface modules can be formed on a substrate layer 1. Said dual interface modules can be cut out from the substrate layer 1 with several dual interface sections 2 (as shown in FIG. 4).

Turning back to FIG. 1, the substrate layer typically consists of a 125 μm thick epoxy laminate. In each dual interface section 2, four through-holes 11, 12, 13, 14 are formed in the substrate layer 1. A first connection element 31, 32 is arranged in two first through-holes 11, 12 by plating the walls of each first through-hole 11, 12 with gold or a similar electrically conductive plating material. Each first connection element 31, 32 is electrically connected to a gold or similarly conductive plated contact pad 41, 42 that is arranged on a first side 1a of the substrate layer 1. Each contact pad 41, 42 has a thickness of approximately 40 μm. One second through-hole 13, 14 extend through each of the contact pads 41, 42. Moreover, each first connection element 31, 32 is electrically connected to a gold or similar conductive plated connection pad 51, 52 that is arranged on a second side 1b of the substrate layer. Each connection pad 51, 52 has a thickness of approximately 40 μm.

A dual interface RFID chip 6 is arranged on the second side 1b of the substrate layer 1 in each dual interface section 2. The dual interface RFID chip 6 is electrically connected to each of the connection pads 51, 52 in the same dual interface section 2 via first wire bonds 61, 62. Two soldering pads 71, 72 are arranged on the second side 1b of the substrate layer 1. Each of the soldering pads 71, 72 forms a tongue that contacts one of the second through-holes 13, 14 with a first side 71a, 72a of the soldering pad 71, 72. The dual interface RFID chip 6 is electrically connected to the each soldering pad 71, 72 in the same dual interface section 2 via second wire bonds 711, 721.

In a second embodiment, tin or tin-lead is applied to the second side 72a, 72b of each soldering pad 71, 72 as a soldering material for use in connecting 711, 721.

A third embodiment does not include wire bonds. Instead the connection pads 51, 52, the dual interface RFID chip 6 and the soldering pads 71, 72 are electrically connected via flip chip connection.

Figure 2:
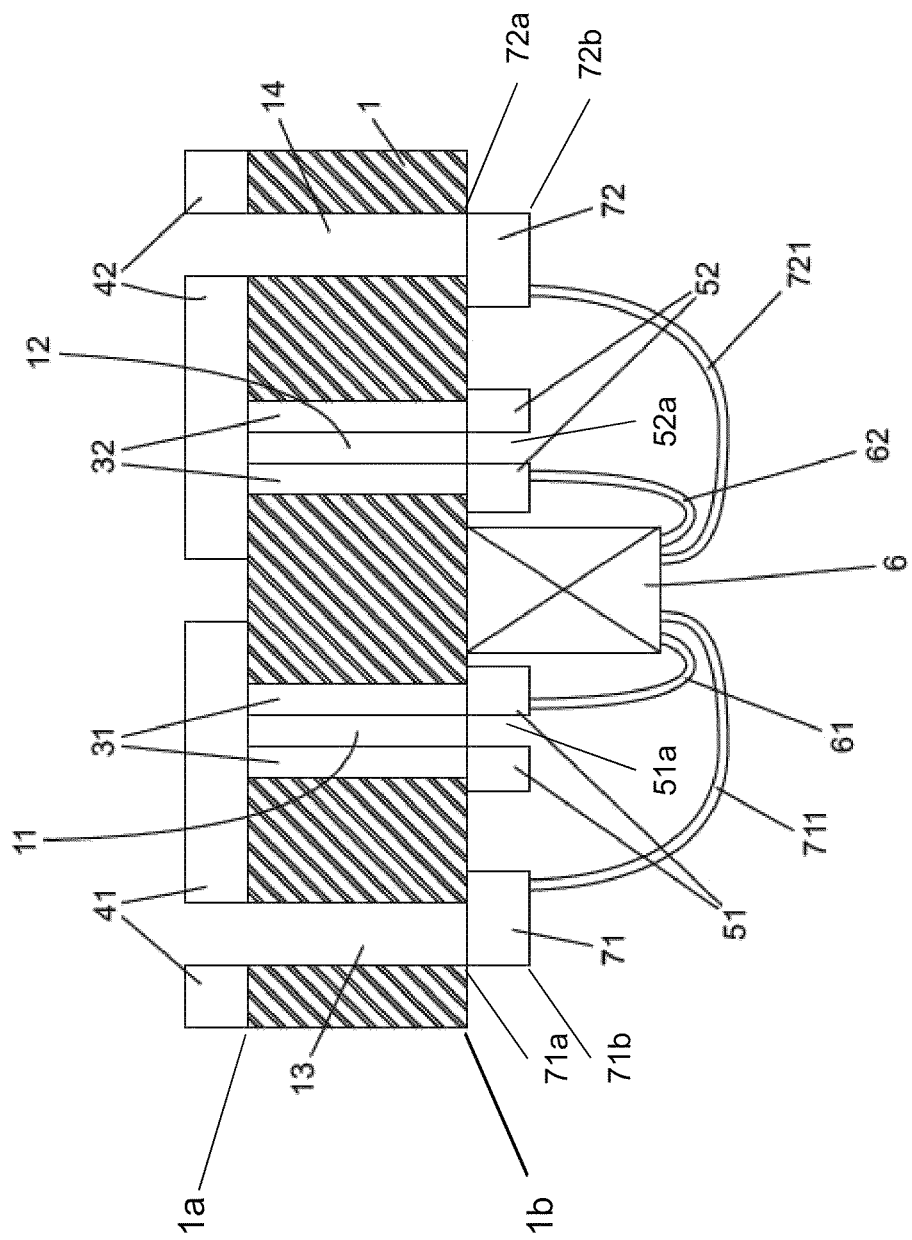
FIG. 2 shows a cross-sectional view of a dual interface module according to another embodiment of the invention.

In a fourth embodiment shown in FIG. 2, each connection pad 51, 52 comprises a third through-hole 51a, 52a that extends first through-hole 11, 12 of the substrate layer 1. This allows easy plating of the walls of each first through-hole 11, 12 with gold or similarly conductive plating material.

Figure 3:
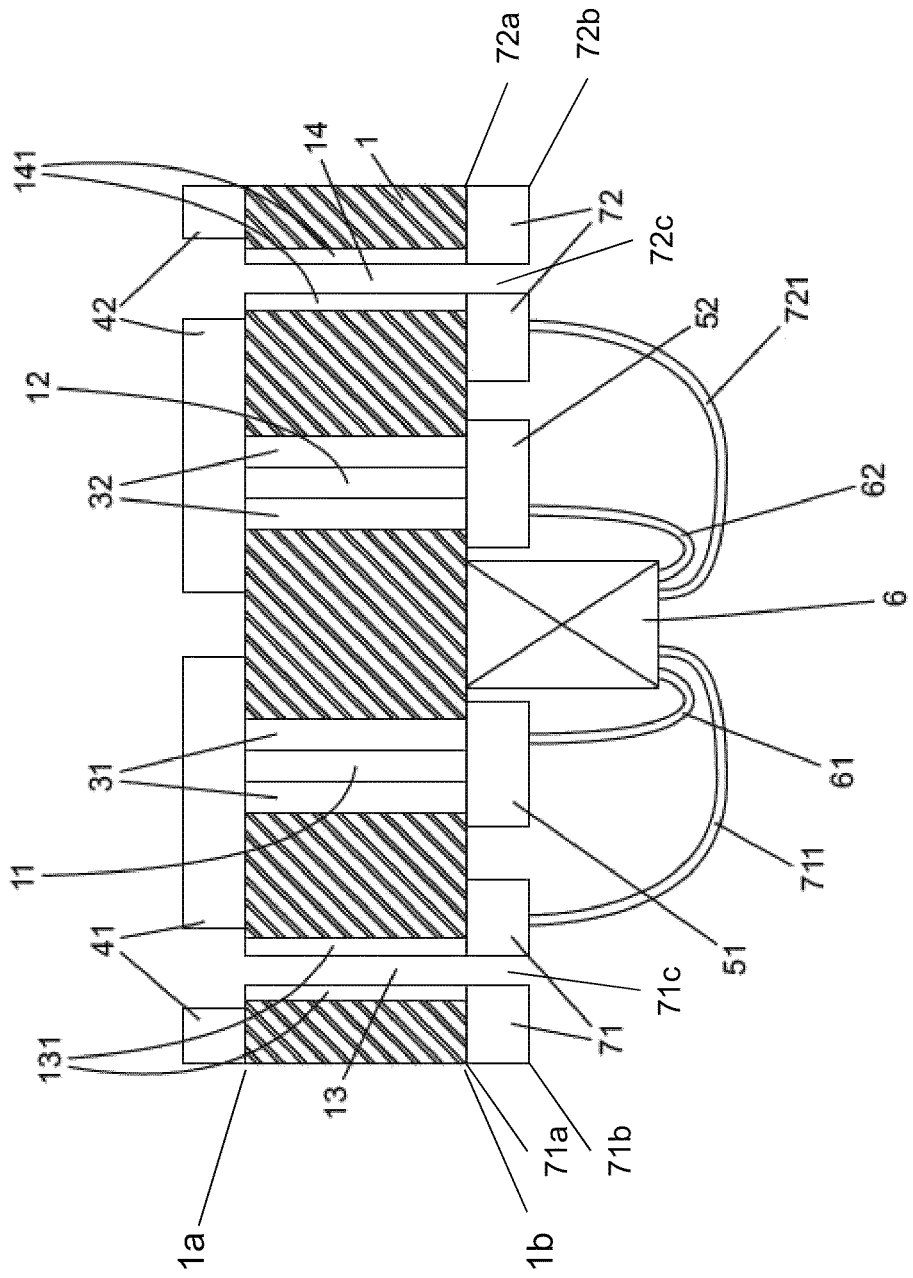
FIG. 3 shows a cross-sectional view of a dual interface module according to yet another embodiment of the invention.

In a fifth embodiment shown in FIG. 3, the walls of the second through-holes 13, 14 are also covered with gold or similar conductive material 131, 141. The contact pads 41, 42 are partly removed so that the contact pads 41, 42 are not electrically connected to the soldering pads 71, 72. Each soldering pad 71, 72 comprises a fourth through-hole 71c, 72c that extends second through-holes 13, 14 of the substrate layer 1.

Figure 5:
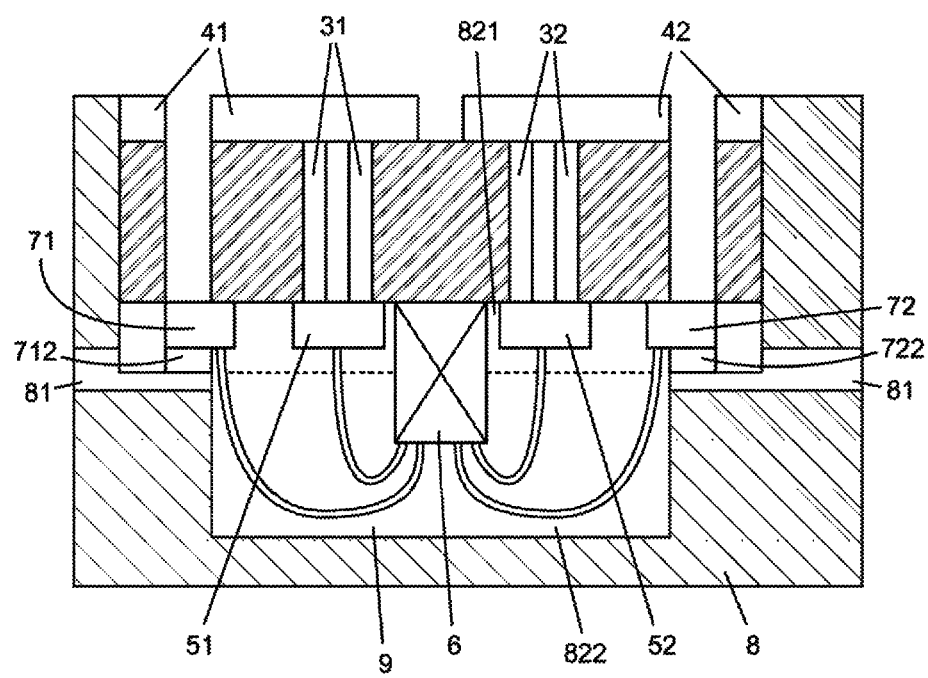
FIG. 5 shows a cross-sectional view of a plastic card including a dual interface module according an embodiment of the invention.

In a sixth embodiment shown in FIG. 5, the production of a dual interface plastic card, including the dual interface module according to FIG. 1, starts with providing a plastic card body 8 including an antenna pad 81. Said antenna pad 81 comprises an antenna consisting of approximately 100 μm thick copper wire. A cavity 821 is formed in the plastic card body 8, and an indention 822 is formed in the cavity 821. A part of the antenna pads 81 is removed to provide two antenna contact areas. Tin or tin-lead is arranged on each antenna contact area as a soldering material 712, 722. An adhesive 9 is arranged in the indention 822. The substrate layer 1, the first connection elements 31, 32, the contact pads 41, 42, the connection pads 51, 52 and the soldering pads 71, 72 are arranged in the cavity 821 and outside of the indention 822 so that each soldering pads 71, 72 contact soldering material 712, 722. The wire bonds 61, 62, 711, 721 (not labeled) are arranged in the indention 822. The dual interface NFC chip 6 is arranged partly in the cavity 821 and partly in the indention 822. A chip implanter, e.g., the CMI 200 plus combined milling and implanting system (available from Mühlbauer AG, Germany), can be used to form the cavity 821 and the indention 822, partly remove the antenna 81, arrange the soldering material 721, 722 on the antenna contact areas and arrange the dual interface module in the cavity 821 and the indention 822. The depth of the cavity 821, not including the depth of the indention 822, is equal to the sum of the thickness of the substrate layer 1, the contact pads 41, 42, the soldering pads 71, 72 and the soldering material 712, 722.

Each soldering pad 71, 72 of the dual interface module is soldered to the antenna 81 by guiding a laser beam on each soldering pad 71, 72 through the second through holes 13, 14 of the dual interface module. The laser beams transfer sufficient thermal energy to the soldering material 712, 722 via the soldering pads 71, 72 to melt the soldering material 712, 722. Said soldering further fixes the dual interface module in the plastic card body 8 and electrically connects the soldering pads 71, 72 with the antenna pad 81. This results in a dual interface plastic card with a mostly even surface. The top surface of the plastic card body 8 and the contact pads 41, 42 are on the same level. The portion of the dual interface module that is not covered by the contact pads 41, 42 is lower by the thickness of the contact pads 41, 42. This difference in card thickness of approximately 40 μm will not typically be noticed by a user. It is possible to personalize the plastic card using any known method.

Figure 6:
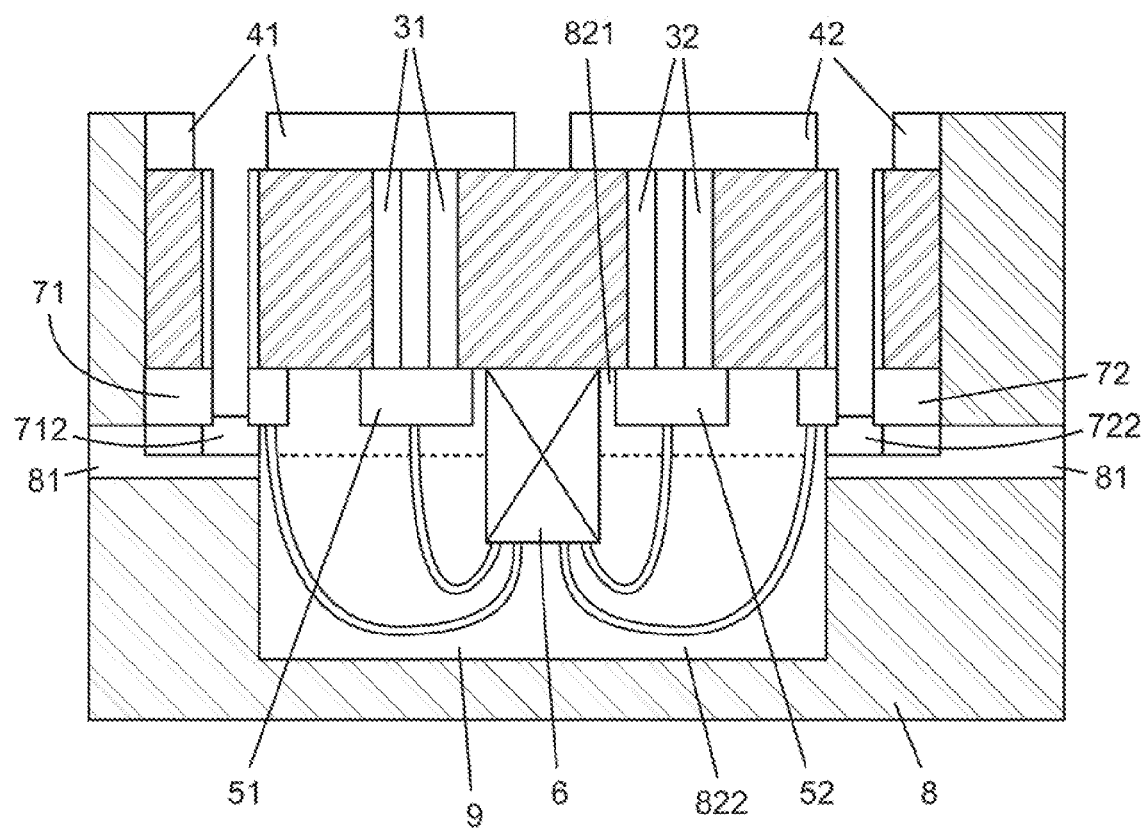
FIG. 6 shows a cross-sectional view of a plastic card including a dual interface module according to another embodiment of the invention.

In a seventh embodiment, a dual interface plastic card is produced using a dual interface module according to FIG. 3. Each soldering pad 71, 72 of the dual interface module is soldered to the antenna 81 by guiding a laser beam through second through holes 13, 14 of the dual interface module, extended through holes in each soldering pad 71, 72. The laser beams transfer sufficient thermal energy to the soldering material 712, 722 to melt the soldering material 712, 722. If the soldering material 712, 722 does not exactly fit between a soldering pad 71, 72 and the antenna contact area it may expand into the through-holes in soldering pads 71, 72 as shown in FIG. 6.

In an eighth embodiment, each soldering pad 71, 72 of the dual interface module is soldered to the antenna 81 by inserting a heating element through the second through holes 13, 14 of the dual interface module to contact each soldering pad 71, 72. The heating element transfers sufficient thermal energy to the soldering material 712, 722 via the soldering pads 71, 72 to melt the soldering material 712, 722. Said soldering fixes the dual interface module in the plastic card body 8 and electrically connects the soldering pads 71, 72 with the antenna pad 81.

In a ninth embodiment, no soldering material 712, 722 is arranged on the antenna contact areas. The dual interface module according to FIG. 1 is substituted by a dual interface module according to the second embodiment of the invention and the dual interface module is soldered to the antenna pads 81 using the soldering material arranged on the second side of the soldering pads 71, 72.

Figure 7:
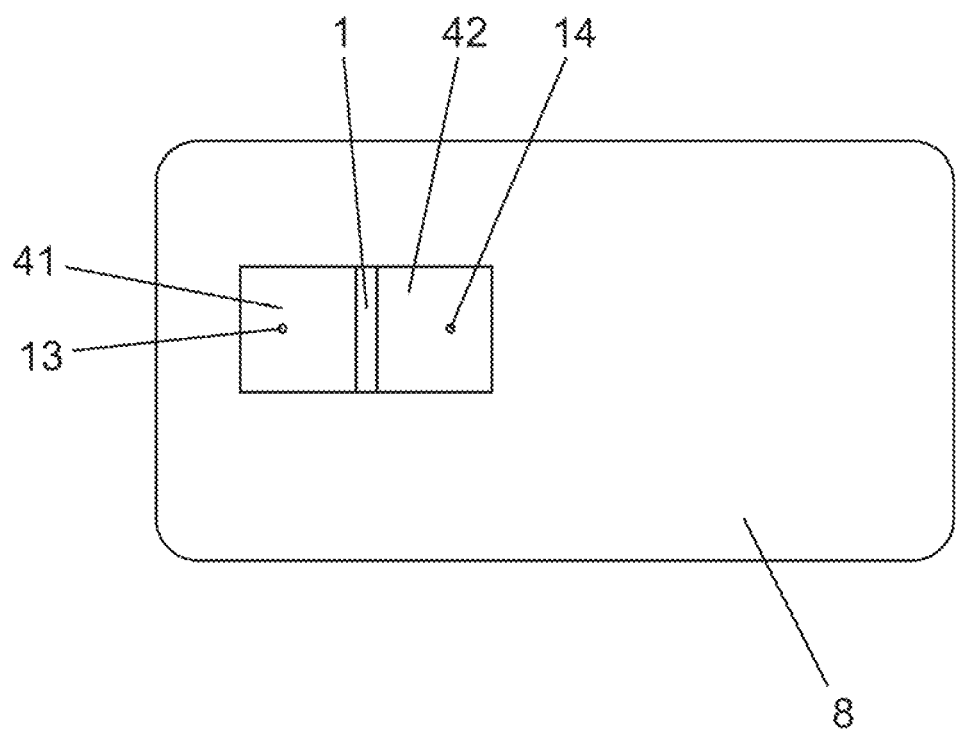
FIG. 7 shows a top view of a plastic card including a dual interface module according to an embodiment of the invention.

Each of the sixth to the ninth embodiments of the invention results in a dual interface plastic card with an even surface as shown in FIG. 7. The surface of the plastic card body 9 and the contact pads 41, 42 are on the same level. It is possible to personalize the plastic card using any known method.

One skilled in the art will realize the invention may be embodied in other specific forms without departing from the spirit or essential characteristics thereof. The foregoing embodiments are therefore to be considered in all respects illustrative rather than limiting of the invention described herein.

What is claimed is:

1. A method for manufacturing a dual interface module, the method comprising:
   providing a substrate layer;
   forming at least one dual interface section on the substrate layer;
   forming at least two first through-holes in the substrate layer in each dual interface section;
   arranging a first connection element in each first through-hole, wherein the first connection elements are provided by covering walls of the first through-holes with an electrically conductive material;
   electrically connecting each first connection element to a contact pad that is arranged on a first side of the substrate layer;
   electrically connecting each first connection element to a connection pad that is arranged on a second side of the substrate layer;
   arranging at least one electronic element on the second side of the substrate layer in each dual interface section, wherein the electronic element is electrically connected to each of the connection pads in the same dual interface section;
   forming two second through-holes in the substrate layer in each dual interface section, wherein walls of the second through-holes are covered with the same electrically conductive material as the first through-holes and the contact pads are partly removed so that no contact pad contacts the electrically conductive material arranged in the second through-holes; and
   arranging two soldering pads with a first side and a second side on the second side of the substrate layer, wherein the first side of each soldering pad contacts a second through-hole and wherein the electronic element is electrically connected to each of the soldering pads in the same dual interface section.

2. The method of claim 1, wherein a soldering material is arranged on the second side of each soldering pad.

3. The method of claim 1, wherein the electronic element is electrically connected to each of the connection pads in the same dual interface section via a second connection element and electrically connected to each of the soldering pads in the same dual interface section via a third connection element and wherein all second connection elements and all third connection elements are wire bonds.

4. The method of claim 1, wherein the electronic element is electrically connected to each of the connection pads in the same dual interface section via flip chip connections and electrically connected to each of the soldering pads in the same dual interface section via flip chip connections.

5. The method of claim 1, wherein several dual interface sections are formed on the substrate layer and several dual interface modules are produced by cutting each dual interface section out of the substrate layer.

* * * * *